(12) United States Patent
Chang et al.

(10) Patent No.: US 7,691,559 B2
(45) Date of Patent: Apr. 6, 2010

(54) IMMERSION LITHOGRAPHY EDGE BEAD REMOVAL

(75) Inventors: Ching-Yu Chang, Yilang (TW); C. C. Ke, Tainan (TW); Vincent Yu, Taichung County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 723 days.

(21) Appl. No.: 11/337,986

(22) Filed: Jan. 24, 2006

(65) Prior Publication Data

US 2007/0003879 A1   Jan. 4, 2007

Related U.S. Application Data

(60) Provisional application No. 60/695,826, filed on Jun. 30, 2005.

(51) Int. Cl.
G03F 7/00 (2006.01)
G03F 7/004 (2006.01)

(52) U.S. Cl. .................... 430/270.1; 430/311; 430/329; 430/330; 430/331

(58) Field of Classification Search ................ 430/311, 430/329, 330, 331
See application file for complete search history.

(56) References Cited

U.S. PATENT DOCUMENTS

| | | | |
|---|---|---|---|
| 4,113,492 A | 9/1978 | Sato et al. |
| 4,510,176 A | 4/1985 | Cuthbert et al. |
| 4,518,678 A | 5/1985 | Allen |
| 4,732,785 A | 3/1988 | Brewer |
| 4,886,728 A | 12/1989 | Salamy et al. |
| 5,362,608 A | 11/1994 | Flaim et al. |
| 5,426,017 A | 6/1995 | Johnson |
| 5,637,436 A | 6/1997 | Johnson |
| 5,750,317 A | 5/1998 | Orth |
| 5,788,477 A | 8/1998 | Jones |
| 5,814,433 A | 9/1998 | Nelson et al. |
| 5,874,202 A | 2/1999 | Orth |
| 5,879,577 A | 3/1999 | Weng et al. |
| 6,114,747 A | 9/2000 | Wei et al. |
| 6,184,156 B1 | 2/2001 | Orth |
| 6,453,916 B1 | 9/2002 | Tran et al. |
| 6,516,815 B1 | 2/2003 | Stevens et al. |
| 6,809,794 B1 | 10/2004 | Sewell |

(Continued)

FOREIGN PATENT DOCUMENTS

EP    1296358 A2    3/2003

(Continued)

OTHER PUBLICATIONS

German Patent Office, Office Action, Sep. 3, 2008, 11 pages, Serial No. 10 2006 029 225.1-51.

(Continued)

Primary Examiner—Amanda C. Walke
(74) Attorney, Agent, or Firm—Haynes and Boone, LLP

(57) ABSTRACT

A method of performing immersion lithography on a semiconductor wafer is provided. The method includes providing a layer of resist onto a surface of the semiconductor wafer. Next, an edge-bead removal process spins the wafer at a speed greater than 1000 revolutions per minute and dispenses solvent through a nozzle while the wafer is spinning. Then, the resist layer is exposed using an immersion lithography exposure system.

22 Claims, 2 Drawing Sheets

U.S. PATENT DOCUMENTS

| | | |
|---|---|---|
| 6,867,884 B1 | 3/2005 | Rozzi |
| 7,354,693 B2 * | 4/2008 | Hatakeyama et al. .... 430/270.1 |
| 2003/0079764 A1 | 5/2003 | Hirose et al. |
| 2004/0224516 A1 * | 11/2004 | Peterson et al. ............. 438/689 |
| 2004/0250839 A1 | 12/2004 | Robertson et al. |
| 2005/0069819 A1 | 3/2005 | Shiobara |

FOREIGN PATENT DOCUMENTS

| | | |
|---|---|---|
| JP | 2001196291 | 7/2001 |
| WO | 2006/027900 A1 | 3/2006 |

OTHER PUBLICATIONS

Search Report issued by European Patent Office, Dutch Patent Application No. 1032067, Apr. 9, 2008.

* cited by examiner

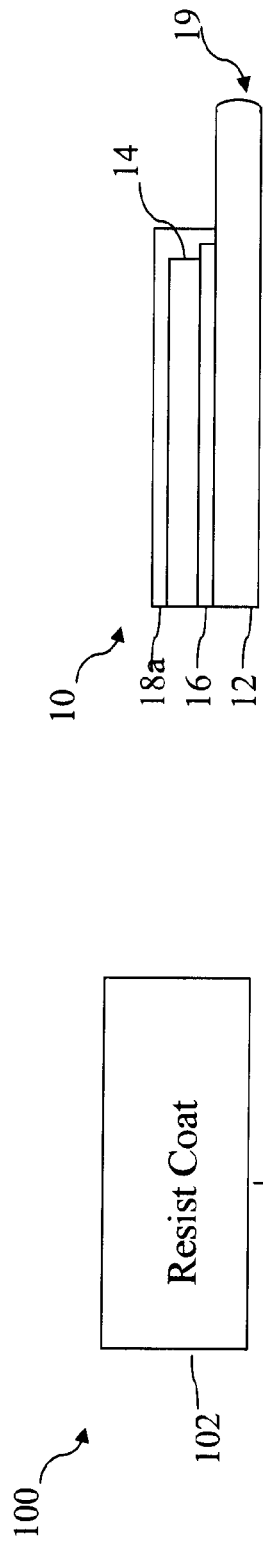
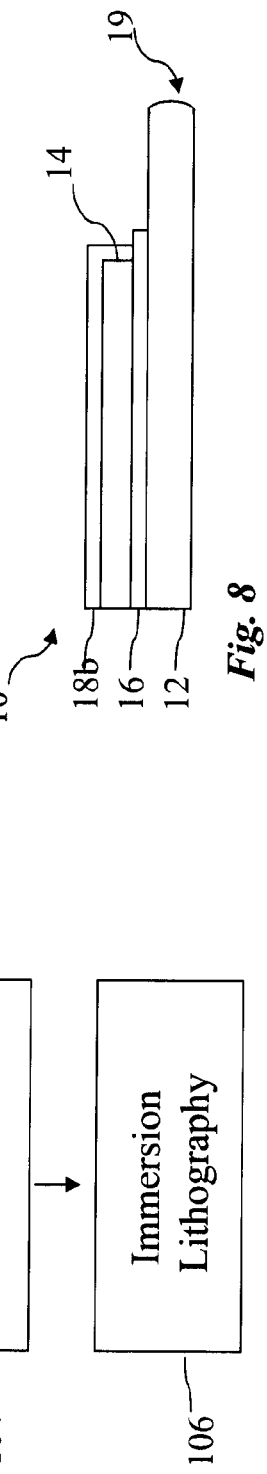
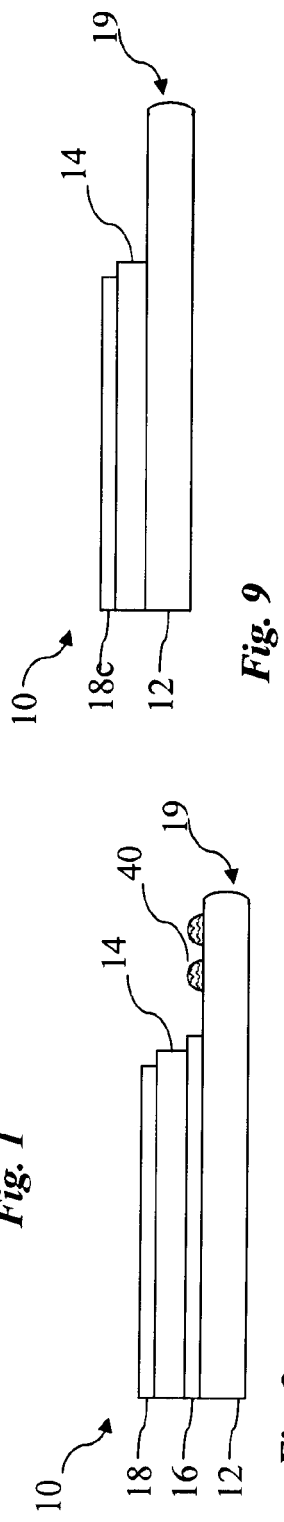
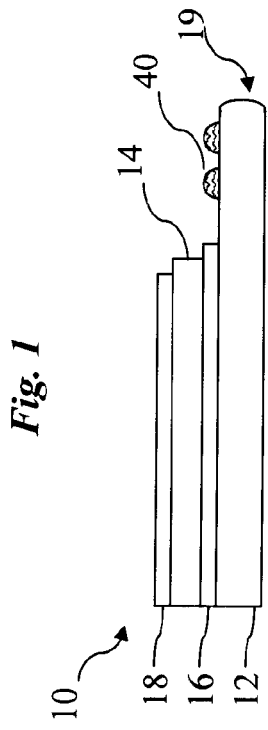
Fig. 1
Fig. 2
Fig. 7
Fig. 8
Fig. 9

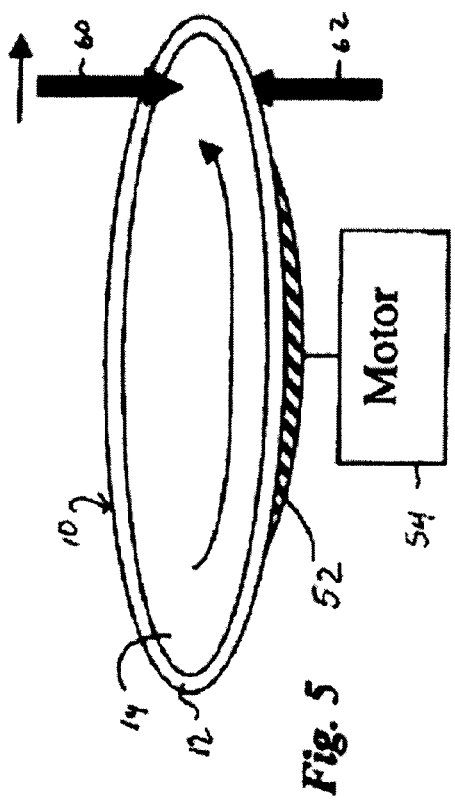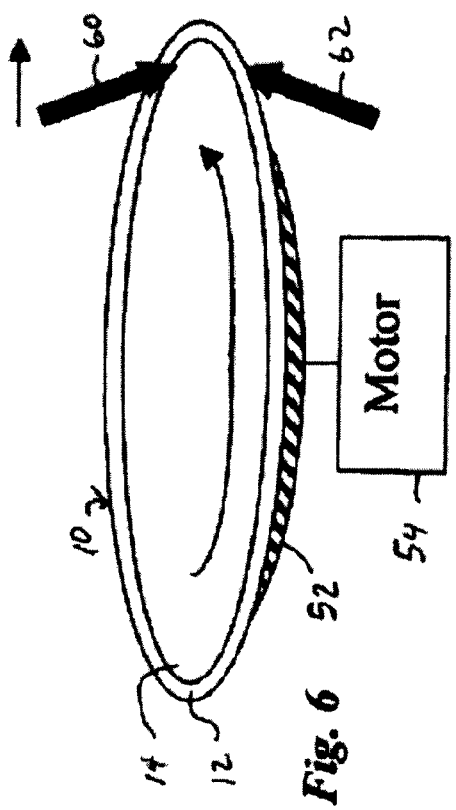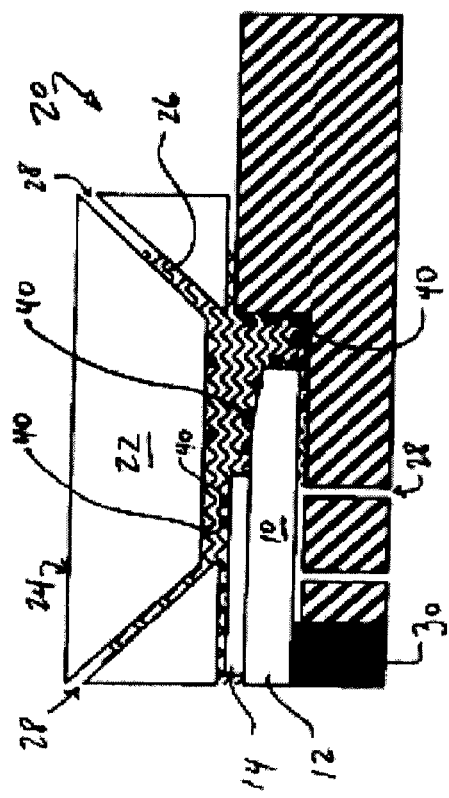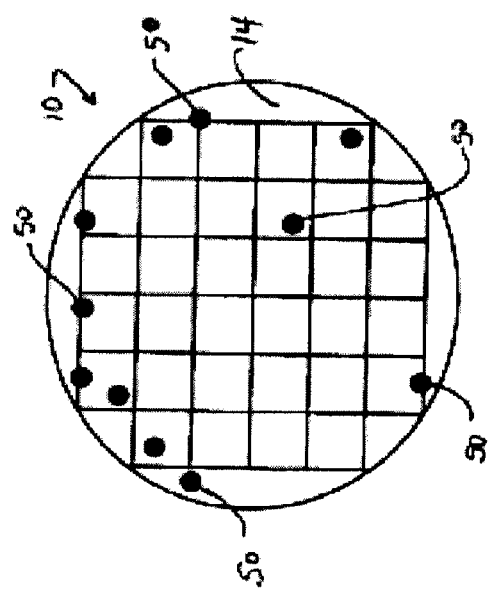

IMMERSION LITHOGRAPHY EDGE BEAD REMOVAL

This patent claims the benefit of U.S. Provisional Ser. No. 60/695,826 filed Jun. 30, 2005, the disclosure of which is hereby incorporated by reference.

BACKGROUND

The present disclosure relates generally to immersion lithography, such as is used in the manufacture of semiconductor integrated circuits.

Lithography is a mechanism by which a pattern on a mask is projected onto a substrate such as a semiconductor wafer. In areas such as semiconductor photolithography, it has become necessary to create images on the semiconductor wafer which incorporate minimum feature sizes under a resolution limit or critical dimension (CD). Currently, CDs are reaching 65 nanometers and less.

Immersion lithography is a new advance in photolithography, in which the exposure procedure is performed with a liquid filling the space between the surface of the wafer and the lens. Using immersion photolithography, higher numerical apertures can be built than when using lenses in air, resulting in improved resolution. Further, immersion provides enhanced depth-of-focus (DOF) for printing ever smaller features.

The immersion exposure step may use de-ionized water or another suitable immersion exposure fluid in the space between the wafer and the lens. Though the exposure time is short, the combination of the fluid and the photosensitive layer (such as photoresist, or simply "resist") can cause heretofore unforeseen problems. For example, resist residue comes into contact with the immersion exposure fluid and/or the lens, thereby contaminating the fluid and/or lens and causing defects on the wafer.

It is desired to provide an immersion lithography process that has reduced contamination of the immersion exposure fluid and lens, and reduced defects on the wafer.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1 is a flow chart of a method for performing immersion lithography, including implementing an edge-bead removal (EBR) process.

FIGS. 2, 7, 8, and 9 are side cross sectional views of the right-most portion (as seen on the figure) of a semiconductor wafer.

FIG. 3 is a side-view diagram of an immersion lithography system.

FIG. 4 is a view of the semiconductor wafer of FIGS. 1, 4 and/or 5 that is suffering from one or more defects.

FIGS. 5-6 are views of different drying processes used in the EBR process of FIG. 6 according to one or more embodiments of the present invention.

DETAILED DESCRIPTION

The present disclosure relates generally to the fabrication of semiconductor devices, and more particularly, to a method and system for the removal of photoresist residue from a semiconductor substrate. It is understood, however, that specific embodiments are provided as examples to teach the broader inventive concept, and one of ordinary skill in the art can easily apply the teachings of the present disclosure to other methods and systems. Also, it is understood that the methods and systems discussed in the present disclosure include some conventional structures and/or steps. Since these structures and steps are well known in the art, they will only be discussed in a general level of detail. Furthermore, reference numbers are repeated throughout the drawings for the sake of convenience and clarity, and such repetition does not indicate any required combination of features or steps throughout the drawings.

Referring to FIG. 1, a simplified flowchart of an embodiment of a process for immersion lithography with a reduced number of defects is designated with the reference numeral 100. In step 102, a photosensitive layer (PSL) is formed over the surface of a wafer substrate. The wafer substrate can include a bare silicon wafer, a thin film stack, polysilicon, silicon nitride, silicon oxide, low-k dielectric, and/conductor materials (e.g., metal)

In one embodiment, the PSL is a polymer photoresist (resist) layer that is about 2500 A for 65 nm lithography, and less than about 1800 A for 55 nm lithography. This is used, in the present embodiment, to maintain a desired ratio of height to width for the circuit geometries associated with the corresponding lithography resolution. A reduce thickness of the PSL can help to reduce or prevent pattern collapse during subsequent processing (e.g., developing, spin drying).

The resist may be a bottom anti-reflective coating (BARC) layer, an underlayer polymer, a silicon-containing polymer, a silicon carbide-containing polymer, negative or positive resist, a top anti-reflective coating (TARC) layer, and may be of a material now known or later developed for this purpose. For example, the resist may be a one- two- or multi-component resist system. The application of the resist may be done with spin-coating or another suitable procedure. Prior to the application of the resist, the wafer may be first processed to prepare it for the photolithography process. For example, the wafer may be cleaned, dried and/or coated with an adhesion-promoting material prior to the application of the resist.

In the present embodiment, a BARC layer is placed on the wafer before the resist is applied, and a top-coat (e.g., TARC) layer is placed on the wafer after the resist is applied. The BARC layer has a height larger than about 50 A, to facilitate coating thickness uniformity and a desired reflectivity. The TARC layer also has a height larger than about 50 A to facilitate coating thickness uniformity.

At step 104, a solvent rinse is applied to remove the resist at the wafer's edge (referred to as "edge-bead"). This process helps to prevent the resist from contaminating during the exposure process. A conventional edge bead removal (EBR) process includes the following parameters shown in Table 1 below. It is a two step process, where the first step spins the wafer at 1000 revolutions per minute for 5 seconds. During this step, two nozzles for dispensing solvent are positioned 1.5 millimeters from the wafer edge, one for the front surface of the wafer, the other for the back surface. It is understood that the terms "front" refer to the side of the wafer with the resist, and "back" refers to the opposite side.

TABLE 1

| Step | R.P.M. | Time (secs) | Nozzle Position (mm) | Fluid Dispense |
|---|---|---|---|---|
| 1 | 1000 | 5 | 1.5 | front and back |
| 2 | 1000 | 5 | — | none (spin dry) |

At step 106, an immersion lithography process is performed. The wafer and resist, (and any other layers) are immersed in an immersion exposure liquid such as de-ionized water, and exposed to a radiation source. The radiation source may be an ultraviolet light source, for example a krypton fluoride (KrF, 248 nm), argon fluoride (ArF, 193 nm), or $F_2$ (157 nm) excimer laser. The wafer is exposed to the radiation for a predetermined amount of time, which is dependent on the type of resist used, the intensity of the ultraviolet light source, and/or other factors. The exposure time may last from about 0.2 seconds to about 30 seconds, for example. After exposure, a post-exposure bake (PEB) is performed for polymer cleavage and a developing process is used to complete the patterning of the resist layer.

Referring to FIG. 2, a semiconductor wafer 10 is one example of a wafer that can be processed by the above-referenced immersion lithography process 100. The wafer 10 includes a substrate 12 and a photosensitive layer 14. The substrate 12 can include one or more layers, including poly, metal, and/or dielectric, that are desired to be patterned. The photosensitive layer 14 can be a photoresist (resist) layer that is responsive to an exposure process for creating patterns.

Although not required, the wafer 10 includes a bottom anti-reflective coating (BARC) layer 16 and a top anti-reflective coating (TARC) layer 18. FIG. 2 only shows the right edge 19 of the wafer 10. The left edge of the wafer 10 may be considered to have a similar profile as that of the right edge 19. Also in FIG. 2, the three layers are shown to have a staggered position, with the BARC layer 16 extending further (closer) towards the wafer edge 19 than the photosensitive layer 14, which extends further towards the wafer edge than the TARC layer 18.

Referring to FIG. 3, after the EBR process, the wafer 10 is provided to an immersion lithography system 20. The immersion lithography system includes a lens system 22, an immersion head 24 for containing a fluid 26 such as de-ionized water, various apertures 28 through which fluid can be added or removed, and a stage 30 for securing and moving the wafer 10 relative to the lens system 22. The stage 30 further includes a structure 32 for containing the fluid 26. In FIG. 3, the lens system 22 and immersion head 24 are positioned near the right edge 19 of the wafer 10. It is understood that the lens 22 and the wafer 10 experience relative movement so that the lens can expose the resist layer 14 over the entire wafer.

Referring to both FIGS. 2 and 3, although not intended to be limiting, a fault mechanism for causing defects during a conventional immersion lithography process occurs when a poor resist cut profile is created and soluble material from the resist 14 forms particles 40, which will produce problems later in the process. In FIG. 2, two particles 40 are shown near the edge 19. The particles 40 may comprise a soluble material from the resist layer 14, BARC layer 16, TARC layer 18, or a combination thereof. In FIG. 3, many particles 40 are shown, not only near the wafer edge 19 but immersed throughout the fluid 26.

It is believed that the fault lies in the EBR process. The centrifugal force of a wafer spinning at 1000 rpm (Table 1) is not strong enough to remove the EBR solvent from the edge of the resist 14. The resist 14 at the edge of the wafer is still soaked with solvent, resulting in a sponge-like condition. In some instances, this causes the resist edge to be soft, which means it will easily spin away during the wafer spin dry step (step 2). The spun-away solvent-rich resist would further peel during a post exposure process. While this has not resulted in a problem in dry lithography, the fluid 26 and/or lens 22 in the immersion lithography system 20 (FIG. 3) can be contaminated with the particles 40 and an increased number of defects occur on the wafer (where the die are).

Referring now to FIG. 4, the wafer 10 is shown after going through an immersion lithography process with a conventional EBR process. The wafer 10 includes defects 50 that have been caused during the process. The defects are caused by the particles 40 illustrated in FIGS. 2-3, and can represent the existence of the particles and/or deformation or "holes type blank pattern" (missing patterns) in the resist. Other types of defects may also exist.

Referring to FIG. 5, to reduce and/or prevent the particles 40 from forming in the immersion fluid 26 and on the lens 22 (as shown in FIG. 3), and to reduce the number of defects 50 in the processed wafer (as shown in FIG. 4), a novel EBR process is provided. The novel EBR process utilizes a chuck 52 being driven by a motor 54, as well as one or more nozzles 60, 62. The motor 54 is capable of spinning the chuck 52 at relatively high speeds, as discussed below, and in some embodiments, the nozzle(s) 60-62 are capable of unique movement coordinated with the motor speeds.

Table 2 below describes an improved two step EBR process (as compared to Table 1 above), where in the first step, the motor 54 spins the chuck 52 (and hence the wafer 10) at a speed greater than 1000 rpm (e.g., 1500 rpm) for about 5 seconds. The two nozzles 60, 62 for dispensing solvent are positioned about 1.5 millimeters from the wafer edge, one for the front surface of the wafer 10, the other for the back surface. Examples of solvent include Propylene glycol monomethyl ether (PGME), propylene glycol monomethyl ether acetate (PGMEA), cyclohexanol, water solution, surfactant solution, or combinations thereof. It is understood that many types of resist are soluble to one or more of the above-listed solvents. The present embodiment increases the centrifugal force on the edge bead and reduces the sponge-like condition of the resist near the edge of the wafer. After the steps of Table 2 have been performed, a pre-exposure baking process can be used to densify the resist polymer and evaporate the solvent.

TABLE 2

| Step | R.P.M. | Time (secs) | Nozzle Position (mm) | Fluid Dispense |
|------|--------|-------------|----------------------|----------------|
| 1 | >1000 | 5 | 1.5 | front and back |
| 2 | 1000 | 5 | — | none (spin dry) |

In another embodiment, the particles 40 are further reduced/prevented from forming in the immersion fluid 26 by a second EBR process. Table 3 below describes an improved four step process. The first step spins the wafer at a speed greater than 1000 rpm (e.g., 2500 rpm) for about 5 seconds. Solvent is dispensed through the nozzle 60 on the front of the wafer 10 at a position that is about 2.5 millimeters from the wafer edge. The second step spins the wafer at a slower speed (e.g., 1000 rpm) for about 5 seconds. Solvent is dispensed through both nozzles 60, 62 on the front and back sides of the wafer 10 at a position that is about 1.5 millimeters from the wafer edge. The third step spins the wafer at an even slower speed (e.g., 500 rpm) for about 5 seconds. Solvent is dispensed through both nozzles 60, 62 on the front and back sides of the wafer 10 at a position that is about 1.0 millimeters from the wafer edge.

TABLE 3

| Step | R.P.M. | Time (secs) | Nozzle Position (mm) | Fluid Dispense |
|---|---|---|---|---|
| 1 | 2500 | 5 | 2.5 | front |
| 2 | 1000 | 5 | 1.5 | front and back |
| 3 | 500 | 5 | 1.0 | front and back |
| 4 | 1000 | 5 | — | none (spin dry) |

The variation in both speed and position prevents or reduces any "bounce back" that may occur from the dispelled resist bouncing all of the walls of the chamber and back onto the wafer surface. Also, the lower speeds serve to clean off the edge of the wafer after the first higher speed steps have removed the edge bead.

Referring to FIG. 6, in some embodiments, the nozzles 60, 62 can be configured at an angle to facilitate the removal of the resist edge bead and/or to reduce bounce back.

Referring to FIGS. 7-9, in other embodiments (as compared to the embodiment of FIG. 2), the TARC layer can extend over the resist layer 14 to help reduce the possibility of resist particle formation. In FIG. 7, the TARC layer is identified with the reference numeral 18a and covers both the resist 14 and the BARC layer 16. The TARC layer 18a extends to a distance that is substantially less than 5 mm from the edge 19 of the wafer substrate 12. In FIG. 8, the TARC layer is identified with the reference numeral 18b and covers the resist layer 14 but not the BARC layer 16. The BARC layer 16 extends to a distance that is closer to the edge 19 of the wafer substrate 12. In FIG. 9, the TARC layer is identified with the reference numeral 18c and covers the resist layer 14. The resist layer 14 extends to a distance that is closer to the edge 19 of the wafer substrate 12. Some of the TARC materials have better adhesion with resist layer than the wafer substrate. The wafer edge film stack as FIG. 9 shows can help prevent wafer edge TARC layer peeling during immersion exposure process.

Table 4 below describes an improved four step EBR process that works well with various combinations of layers, including those with the TARC layers 18a and 18b discussed above. The first step spins the wafer at a speed greater than 1000 rpm (e.g., 2500 rpm) for about 5 seconds. Solvent is dispensed through the nozzle 60 on the front of the wafer 10 at a position that is about 1.5 millimeters from the wafer edge. Examples of solvent include PGME, PGMEA, cyclohexanol, water solution, surfactant solution, or combinations thereof. The second step spins the wafer at a slower speed (e.g., 1000 rpm) for about 5 seconds. Solvent is dispensed through both nozzles 60, 62 on the front and back sides of the wafer 10 at a position that is about 1.0 millimeters from the wafer edge. The third step spins the wafer at an even slower speed (e.g., 500 rpm) for about 5 seconds. Solvent is dispensed through both nozzles 60, 62 on the front and back sides of the wafer 10 at a position that is about 1.0 millimeters from the wafer edge.

TABLE 3

| Step | R.P.M. | Time (secs) | Nozzle Position (mm) | Fluid Dispense |
|---|---|---|---|---|
| 1 | 2500 | 5 | 1.5 | front |
| 2 | 1000 | 5 | 1.0 | front and back |
| 3 | 500 | 5 | 1.0 | front and back |
| 4 | 1000 | 5 | — | none (spin dry) |

Although only a few exemplary embodiments of this invention have been described in detail above, those skilled in the art will readily appreciate that many modifications are possible in the exemplary embodiments without materially departing from the novel teachings and advantages of this invention. It is understood that various different combinations of the above-listed treatment steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this invention.

In one embodiment, a method of performing immersion lithography on a semiconductor wafer is provided. The method includes providing a layer of resist onto a surface of the semiconductor wafer. Next, an edge-bead removal process spins the wafer at a speed greater than 1000 revolutions per minute (e.g., about 1500 rpm) and dispenses solvent through a nozzle while the wafer is spinning. Then, the resist layer is exposed using an immersion lithography exposure system.

In some embodiments, the edge bead removal step includes a first spin process that spins the wafer at a first speed greater than 1000 rpm and dispenses solvent towards an edge of the wafer while spinning, a second spin process that spins the wafer at a second speed less than the first speed and dispenses solvent towards the edge of the wafer while spinning, and a third spin process that spins the wafer at a third speed less than the second speed and dispenses solvent towards the edge of the wafer while spinning.

In another embodiment, a method of performing immersion lithography on a semiconductor substrate includes providing a layer of resist onto a surface of the semiconductor substrate, the resist layer extending near an edge of the substrate. A top anti-reflective coating (TARC) layer is formed over the resist, the TARC layer extending nearer to the edge of the substrate than the resist layer, thereby encapsulating the resist layer. An edge-bead removal (EBR) process is then performed. The EBR process includes spinning the wafer at a speed greater than 1000 revolutions per minute (rpm) and dispensing solvent through a nozzle while the wafer is spinning. Afterwards, the resist layer is exposed using an immersion lithography exposure system.

In another embodiment, an edge-bead removal system for use with an immersion lithography process is provided. The system includes a multi-speed motor for spinning a wafer chuck. The motor is configured to sequentially maintain a first speed for the chuck greater than 1000 rpm, a second speed for the chuck at about 1000 rpm, and a third speed for the chuck at less than 1000 rpm. The system also includes a first nozzle positioned on the chuck near where an edge of a semiconductor wafer would reside on the chuck, the first nozzle for dispensing a solvent.

In some embodiments, the first nozzle is configured to be positioned at different locations corresponding to at least two different speeds of the chuck.

In some embodiments, the multi-speed motor is further configured such that the first speed is about 2500 rpm, the second speed is about 1000 rpm, and the third speed is about 500 rpm.

In some embodiments, the system also includes a second nozzle positioned on the chuck near where an edge of a semiconductor wafer would reside on the chuck. The second nozzle dispenses a solvent onto a side of the semiconductor wafer opposite to the side on which the first nozzle dispenses solvent. The first nozzle is configurable to dispense solvent at about 2.5 millimeters (mm) from the wafer edge when the motor is at the first speed. The first and second nozzles are configurable to dispense solvent at between 1.0 mm and 1.5 mm from the wafer edge when the motor is at the second speed. The first and second nozzle are also configurable to dispense solvent at about 1.0 mm from the wafer edge when the motor is at the third speed.

We claim:

1. A method of processing a semiconductor wafer, comprising:

forming a photosensitive layer on the semiconductor wafer;

dispensing a first liquid to a front-side edge of the semiconductor wafer at a first distance while spinning the semiconductor wafer at a first speed greater than about 2000 rpm, wherein the photosensitive layer is soluble to the first liquid;

spin drying the semiconductor wafer;

baking the semiconductor wafer;

exposing the photosensitive layer;

post-exposure baking the photosensitive layer; and developing the photosensitive layer.

2. A method of processing a semiconductor wafer, comprising:

forming a photosensitive layer on the semiconductor wafer;

dispensing a first liquid to a front-side edge of the semiconductor wafer at a first distance while spinning the semiconductor wafer at a first speed greater than about 2000 rpm;

dispensing a second liquid to the front-side edge of the semiconductor wafer edge at a second distance while spinning the semiconductor wafer at a second speed;

spin drying the semiconductor wafer;

baking the semiconductor wafer;

exposing the photosensitive layer;

post-exposure baking the photosensitive layer; and developing the photosensitive layer.

3. The method of claim 2, wherein the second liquid comprises a material from the group consisting of PGME, PGMEA, cyclohexanol, water solution, surfactant solution, and combinations thereof.

4. The method of claim 2, wherein the second distance is less than the first distance.

5. The method of claim 2, further comprising:

dispensing a third liquid to the front-side edge of the semiconductor wafer edge at a third distance while spinning the semiconductor wafer at a third speed.

6. The method of claim 5, wherein the third liquid comprises a material from the group consisting of PGME, PGMEA, cyclohexanol, water solution, surfactant solution, and combinations thereof.

7. The method of claim 5, wherein the third distance is less than the second distance.

8. The method of claim 2, wherein the first liquid comprises a material from the group consisting of PGME, PGMEA, cyclohexanol, water solution, surfactant solution, and combinations thereof.

9. A method for processing a semiconductor wafer, comprising:

providing a substrate on the semiconductor wafer;

forming a photosensitive layer for immersion lithography on the substrate, wherein a height of the photosensitive layer is substantially less than 2500A;

performing an edge-bead removal process, including spinning the substrate at a plurality of speeds, one such speed being greater than 1500 revolutions per minute (rpm) and dispensing solvent through a nozzle while the substrate is spinning during each of the plurality of speeds, wherein the photosensitive layer is soluble in the solvent;

exposing the photosensitive layer by radiation; and developing the exposed photosensitive layer.

10. The method of claim 9, wherein the substrate includes at least one layer of material from the group consisting of bare silicon, polysilicon, silicon nitride, silicon oxide, low-k dielectric, and conductor.

11. The method of claim 9, wherein the photosensitive layer extends within 5 mm of an outer edge of the semiconductor wafer.

12. The method of claim 11, wherein the photosensitive layer extends within 2-4 mm of the outer edge of the semiconductor wafer.

13. A semiconductor wafer produced by the method of claim 9.

14. The method of claim 9, further comprising:

forming a bottom antireflective coating (BARC) layer on the substrate prior to forming the photosensitive layer.

15. The method of claim 14 wherein the BARC layer has a height that is substantially larger than 50A.

16. The method of claim 14, wherein the BARC layer extends to a distance less than 5 mm of an outer edge of the semiconductor wafer.

17. The method of claim 9, further comprising:

forming a top-coat layer on the substrate after forming the photosensitive layer.

18. The method of claim 17 wherein the top-coat layer has a height that is substantially larger than 50A.

19. The method of claim 17 wherein the top-coat layer extends over an outer edge of the photosensitive layer.

20. The method of claim 17 wherein the top-coat layer does not extend over an outer edge of the photosensitive layer.

21. The method of claim 17 wherein the top-coat layer extends within 5 mm of an outer edge of the semiconductor wafer.

22. A method of performing immersion lithography on a semiconductor wafer, comprising:

providing a layer of resist onto a surface of the semiconductor wafer;

performing an edge-bead removal process, including spinning the wafer at a first speed greater than 1000 rpm, spinning the wafer at a second speed less than the first speed, and dispensing solvent towards the edge of the wafer while spinning at the first speed and the second speed; and exposing the resist layer using an immersion lithography exposure system.

* * * * *